(12) United States Patent
Dong et al.

(10) Patent No.: US 12,237,449 B2
(45) Date of Patent: Feb. 25, 2025

(54) BACKLIGHT MODULE AND MANUFACTURING METHOD THEREFOR, AND DISPLAY APPARATUS

(71) Applicants: BOE MLED Technology Co., Ltd., Beijing (CN); BOE Technology Group Co., Ltd., Beijing (CN)

(72) Inventors: Enkai Dong, Beijing (CN); Liang Sun, Beijing (CN); Jiacheng Qi, Beijing (CN)

(73) Assignees: BOE MLED Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/561,741

(22) PCT Filed: May 27, 2021

(86) PCT No.: PCT/CN2021/096428
§ 371 (c)(1),
(2) Date: Nov. 17, 2023

(87) PCT Pub. No.: WO2022/246745
PCT Pub. Date: Dec. 1, 2022

(65) Prior Publication Data
US 2024/0274763 A1    Aug. 15, 2024

(51) Int. Cl.
*H01L 33/54* (2010.01)
*G02F 1/1335* (2006.01)
*G02F 1/13357* (2006.01)

(52) U.S. Cl.
CPC ........ *H01L 33/54* (2013.01); *G02F 1/133603* (2013.01); *G02F 1/133612* (2021.01)

(58) Field of Classification Search
CPC ..... H01L 33/54; H01L 25/13; H01L 25/0753; H01L 27/15; H01L 33/56; G02F 1/133603; G02F 1/133612; G02F 1/1336
See application file for complete search history.

(56) References Cited

U.S. PATENT DOCUMENTS

| 2007/0241357 A1* | 10/2007 | Yan ......................... H01L 33/58 |
| | | 257/E33.001 |
| 2008/0191227 A1* | 8/2008 | Kimura ................... H01L 33/62 |
| | | 257/E33.057 |

(Continued)

FOREIGN PATENT DOCUMENTS

| CN | 102005520 A | 4/2011 |
| CN | 105990492 A | 10/2016 |

(Continued)

OTHER PUBLICATIONS

International Search Report for PCT/CN2021/096428 Mailed Mar. 2, 2022.

*Primary Examiner* — Kevin Quarterman
(74) *Attorney, Agent, or Firm* — Ling Wu; Stephen Yang; Ling and Yang Intellectual Property

(57) ABSTRACT

A backlight module comprises a driving backplate, which comprises multiple pads; multiple light-emitting diodes, which are electrically connected to the pads; and multiple transparent protection structures, which are located on the sides of the multiple light-emitting diodes that are away from the driving backplate, wherein the transparent protection structures cover the light-emitting diodes, there is a first distance between the center of the orthographic projection of each transparent protection structure on the driving backplate and the center of the orthographic projection of each light-emitting diode on the driving backplate; and the length of the orthographic projection of each light-emitting diode on the driving backplate is a second distance, the width of (Continued)

the orthographic projection of each light-emitting diode on the driving backplate is a third distance, the ratio of the first distance to the second distance is less than or equal to 1:2-1:10.

20 Claims, 10 Drawing Sheets

(56) References Cited

U.S. PATENT DOCUMENTS

| | | |
|---|---|---|
| 2012/0243261 A1 | 9/2012 | Yamamoto et al. |
| 2016/0240752 A1 | 8/2016 | Chiu et al. |
| 2017/0062674 A1* | 3/2017 | Kwon .................. H01L 25/0753 |
| 2017/0069612 A1 | 3/2017 | Zhang et al. |
| 2018/0342555 A1 | 11/2018 | Chen |
| 2020/0203563 A1 | 6/2020 | Wei et al. |
| 2021/0005583 A1 | 1/2021 | Iguchi et al. |
| 2021/0035959 A1 | 2/2021 | Yang |
| 2023/0058002 A1 | 2/2023 | Huang et al. |

FOREIGN PATENT DOCUMENTS

| | | |
|---|---|---|
| CN | 107170771 A | 9/2017 |
| CN | 108493313 A | 9/2018 |
| CN | 108732818 A | 11/2018 |
| CN | 109411458 A | 3/2019 |
| CN | 110875345 A | 3/2020 |
| CN | 210982988 U | 7/2020 |
| CN | 111653689 A | 9/2020 |
| CN | 112216684 A | 1/2021 |
| WO | 2020263181 A1 | 12/2020 |

* cited by examiner

BACKLIGHT MODULE AND MANUFACTURING METHOD THEREFOR, AND DISPLAY APPARATUS

CROSS-REFERENCE TO RELATED APPLICATION

The present application is a U.S. National Phase Entry of International Application PCT/CN2021/096428 having an international filing date of May 27, 2021, and entitled "Backlight Module and Manufacturing Method therefor, and Display Apparatus", the contents of which are hereby incorporated herein by reference in their entireties.

TECHNICAL FIELD

The present disclosure relates to the field of display technology, in particular to a backlight module, a method for manufacturing the backlight module and a display apparatus.

BACKGROUND

With the rise of organic electroluminescence (OLED) industry, requirements of thin module and high color gamut have caused a great impact on the conventional liquid crystal display (LCD) industry. In order to respond to the challenge of OLED, Mini LEDs came into being. When Mini LEDs are used as panel backlight source, it can achieve more precise dynamic backlight effect, which can effectively improve brightness and contrast of a screen, and at the same time solve a glare phenomenon caused by conventional dynamic backlight between bright and dark areas of the screen, and optimize the visual experience.

SUMMARY

An embodiment of the present disclosure provides a backlight module, a manufacturing method thereof and a display apparatus, the specific scheme of which is as follows:

In an aspect, an embodiment of the present disclosure provides a backlight module, including:
a driving backplate including a plurality of pads;
a plurality of light-emitting diodes electrically connected with the pads;
a plurality of transparent protection structures located at a side of the plurality of light-emitting diodes facing away from the driving backplate, wherein the transparent protection structures cover the light-emitting diodes, and a first distance is provided between a geometric center of an orthographic projection of each transparent protection structure on the driving backplate and a geometric center of an orthographic projection of a respective light-emitting diode on the driving backplate, a length of the orthographic projection of the light-emitting diode on the driving backplate is a second distance, a width of the orthographic projection of the light-emitting diode on the driving backplate is a third distance, a ratio of the first distance to the second distance is less than or equal to 1:2-1:10, and a ratio of the first distance to the third distance is less than or equal to 1:2-1:10.

Optionally, in the above-mentioned backlight module according to the embodiment of the present disclosure, the first distance is less than or equal to 50 μm, the second distance is greater than or equal to 100 μm and less than or equal to 500 μm, and the third distance is equal to the second distance.

Optionally, in the above-mentioned backlight module according to the embodiment of the present disclosure, a distance between a boundary of the orthographic projection of the transparent protection structure on the driving backplate and a boundary of the orthographic projection of the light-emitting diode on the driving backplate is greater than 50 μm and less than a half of a distance between geometric centers of two adjacent light-emitting diodes.

Optionally, in the above-mentioned backlight module according to the embodiment of the present disclosure, a distance between adjacent transparent protection structures is greater than 40 μm.

Optionally, in the above-mentioned backlight module according to the embodiment of the present disclosure, a surface of the transparent protection structure includes a curved surface and an opening of the curved surface faces the light-emitting diode.

Optionally, in the above-described backlight module according to the embodiment of the present disclosure, in a direction facing away from the driving backplate, a width of the curved surface in a direction parallel to the driving backplate is gradually reduced.

Optionally, in the backlight module according to the embodiment of the present disclosure, surfaces of the transparent protection structure further includes a plurality of side surfaces extending from an opening side of the curved surface to be in contact with the driving backplate in a direction perpendicular to a plane where the driving backplate is located, and a shape formed by the plurality of side surfaces is approximately the same as a window shape of the steel mesh.

Optionally, in the backlight module according to the embodiment of the present disclosure, the light-emitting diodes are Mini light-emitting diodes.

In another aspect, an embodiment of the present disclosure provides a method for manufacturing a backlight module, including:
providing one driving backplate electrically connected with a plurality of light-emitting diodes, wherein the light-emitting diodes are electrically connected with pads of the driving backplate;
placing a steel mesh on the plurality of light-emitting diodes, wherein a window of the steel mesh completely exposes a light-emitting diode, and a distance from a surface of the steel mesh facing away from the driving backplate to a plane where the driving backplate is located is larger than a distance from a surface of the light-emitting diode facing away from the driving backplate to the plane where the driving backplate is located;
forming a transparent protective pattern in the window of the steel mesh;
solidifying the transparent protection pattern to form a transparent protection structure covering the light-emitting diode.

Optionally, in the method according to the embodiment of the present disclosure, forming the transparent protective pattern in the window of the steel mesh includes:
forming a transparent protective layer on a whole surface of the steel mesh facing away from the driving backplate; and
removing the transparent protective layer on the surface of the steel mesh by a scraper to form the transparent protective pattern in the window of the steel mesh.

Optionally, in the method according to the embodiment of the present disclosure, solidifying the transparent protective pattern includes:

pre-solidifying the transparent protective pattern for 10 mins-20 mins at a temperature of 100° C.-150° C. under constraint of the steel mesh;

removing the steel mesh; and finally solidifying the transparent protective pattern for 30 mins-60 mins at the temperature of 100° C.-150° C.

Optionally, in the method according to the embodiment of the present disclosure, prior to solidifying the transparent protective pattern, the method further includes the following: removing the steel mesh.

Optionally, in the method according to the embodiment of the present disclosure, solidifying the transparent protective pattern includes:

solidifying the transparent protective pattern for 40 mins-80 mins finally at the temperature of 100° C.-150° C.

In another aspect, an embodiment of the present disclosure provides a display apparatus including the backlight module according to the embodiment of the present disclosure.

DETAILED DESCRIPTION

Figure 1:
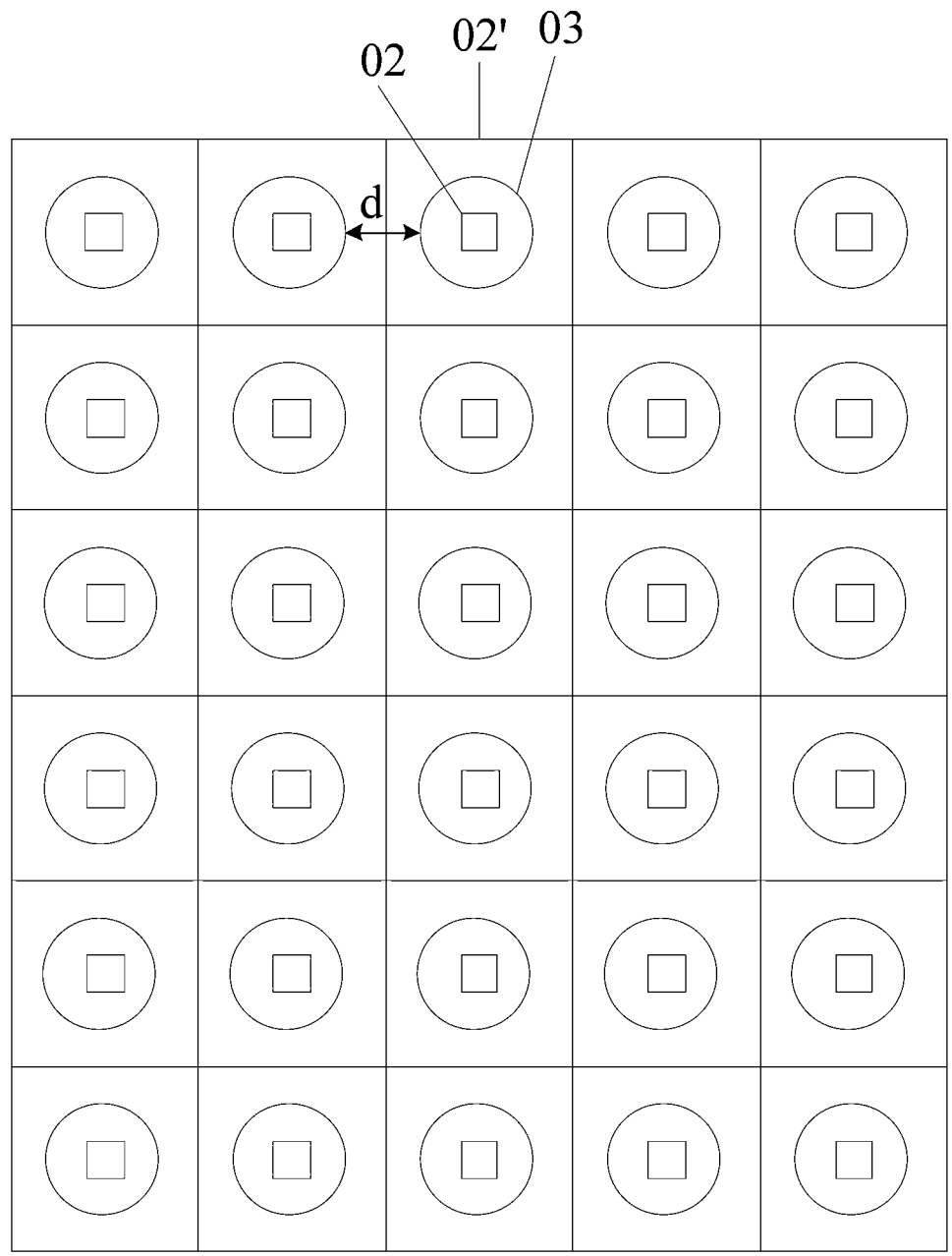
FIG. 1 is a schematic diagram of a structure of a backlight module according to an embodiment of the present disclosure.

In order to make objectives, technical solutions and advantages of the embodiments of the present disclosure more clear, the technical solutions of the embodiments of the present disclosure will be clearly and completely described below with reference to the drawings of the embodiments of the present disclosure. It should be noted that sizes and shapes of various figures in the drawings do not reflect actual scales, and are only for the purpose of schematically illustrating contents of the present disclosure. Moreover, same or similar elements and elements having same or similar functions are denoted by same or similar reference numerals throughout the descriptions.

Unless otherwise defined, technical terms or scientific terms used herein shall have an ordinary meanings understood by those with ordinary skills in the art to which the present disclosure pertains. The "first", "second" and similar terms used in specification and claims of the present disclosure do not indicate any order, quantity, or importance, but are used only for distinguishing different components. "Include", "contain", or a similar word mean that elements or objects appearing before the word cover elements or objects listed after the words and their equivalents, but do not exclude other elements or objects. "Inner", "outer", "upper", "lower", etc., are used to represent relative position relations, and when an absolute position of a described object is changed, the relative position relation may also be correspondingly changed.

A light source of a backlight module in a passive display apparatus is composed of several MiniLEDs. In order to prevent the MiniLEDs from being scratched during production and transportation, which will affect reliability and yield of products, protective glue is usually provided above the MiniLEDs. For example, all MiniLEDs can be encapsulated and protected by transparent protective glue coated over a whole surface. Alternatively, an one-by-one protection method is employed, that is, one transparent protection structure is formed above each Mini LED, which can serve a protection function and improve a light efficiency at the same time. In specific implementation, glue is dispensed on each Mini LED by using a glue dispenser, and then a transparent protection structure is formed by heating and solidifying. In theoretical design, a geometric center of the transparent protective glue should coincide with a geometric center of the Mini LED, so that a protection effect of the transparent protective glue and an effect of improving the light efficiency are optimal, and optical uniformity of the backlight module is the best. However, the inventor found that due to influence of dispensing accuracy, a tolerance distance between the geometric center of the transparent protective glue and the geometric center of Mini LED may be up to 100 μm, while a magnitude of a side length of a light-emitting surface of a Mini LED is normally about 100 μm-500 μm. It can be seen that compared with Mini LED with smaller size, the manufacturing tolerance of the transparent protective glue formed by single point in the one-by-one manner is larger, thus weakening the protective effect of transparent protective glue and improvement of the light efficiency.

In order to solve at least the above technical problems existing in the related art, an embodiment of the present disclosure provides a backlight module, as shown in FIGS. 1 to 4, which may include:

a driving backplate 01 including a plurality of pads 101;

a plurality of light-emitting diodes 02 electrically connected to the pads 101;

a plurality of transparent protection structures 03 located at a side of the plurality of light-emitting diodes 02 facing away from the driving backplate 01, wherein the transparent protection structures 03 cover the light-emitting diodes, and there is a first distance $d_1$ between a geometric center $X_1$ of an orthographic projection of a transparent protection structure 03 on the driving backplate 01 and a geometric center $X_2$ of an orthographic projection of a light-emitting diode 02 on the driving backplate 01, a length of the orthographic projection of the light-emitting diode 02 on the driving backplate 01 is a second distance $d_2$, a width of the orthographic projection of the light-emitting diode 02 on the driving backplate 01 is a third distance $d_3$, a ratio of the first distance $d_1$ to the second distance $d_2$ (i.e. $d_1:d_2$) may be less than or equal to 1:2-1:10, and a ratio of the first distance $d_1$ to the third distance $d_3$ (i.e. $d_1:d_3$) may be less than or equal to 1:2-1:10.

In the above-mentioned backlight module according to the embodiment of the present disclosure, the transparent protection structure 03 can be manufactured by steel mesh printing. Size adjustment of the transparent protection structure 03 can be achieved by adjusting a window size of the steel mesh, and height adjustment of the transparent protection structure 03 in a direction perpendicular to the plane where the steel mesh is located can be achieved by adjusting a thickness of the steel mesh in the direction perpendicular to the plane where the steel mesh is located, so that the ratio between the first distance $d_1$ (between the geometric center $X_1$ of the orthographic projection of the transparent protection structure 03 on the driving back plate 01 and the geometric center $X_2$ of the orthographic projection of the light-emitting diode 02 on the driving back plate 01) and the side length size (i.e., the second distance $d_2$ or the third distance $d_3$) is reduced from 1:1-1:5 to less than or equal to 1:2-1:10, thereby improving the protection effect of the transparent protection structure on the covered light-emitting diode and improving the light efficiency.

In addition, compared with a glue dispensing mode, shape, size and height of the finally formed transparent protection structure 03 can be accurately adjusted by steel mesh printing in the present disclosure, so that uniformity of the transparent protection structure 03 in the present disclosure is better. In addition, if the transparent protection structure is formed by glue dispensing, it is necessary to dispense one by one for the light-emitting diodes 02, and an overall efficiency is low. However, the steel mesh mold used in the present disclosure is not limited by the number of light-emitting diodes 02, and glue can be coated on the light-emitting diodes 02 at all positions at one time, so that production efficiency can be improved to tens of panels/hour.

In some embodiments, in the above-mentioned backlight module according to the embodiment of the present disclosure, the first distance $d_1$ can be reduced by at least 50% by using steel mesh printing compared with the related art, for example, reduced from 100 μm to at least 50 μm.

In some embodiments, a light-emitting surface of the light-emitting diode 02 may have two side edges of an equal length (i.e. a light-emitting surface of the light-emitting diode 02 is square), or the light-emitting surface of the light-emitting diode 02 may have side edges of different lengths (e.g. non-square rectangular shape). In the present disclosure, description is made by taking an example in which the light-emitting surface of the light-emitting diode 02 is square, as shown in FIG. 1. In this case, the third distance $d_3$ may be equal to the second distance $d_2$. In some embodiments, the light-emitting diode 02 may be a Mini LED, the second distance $d_2$ and the third distance $d_3$ may be greater than or equal to 100 μm and less than or equal to 500 μm.

In some embodiments, as shown in FIG. 1, only one light-emitting diode 02 is included in one light-emitting unit 02'. In some other embodiments, one light-emitting unit 02' may further include a plurality of light-emitting diodes 02, for example, may include two or more light-emitting diodes 02, which are not specifically limited herein. In some embodiments, a plurality of light-emitting diodes 02 included in one light-emitting unit 02' may be connected in series parallel or in a series-parallel combination, which is not specifically limited.

Figure 3:
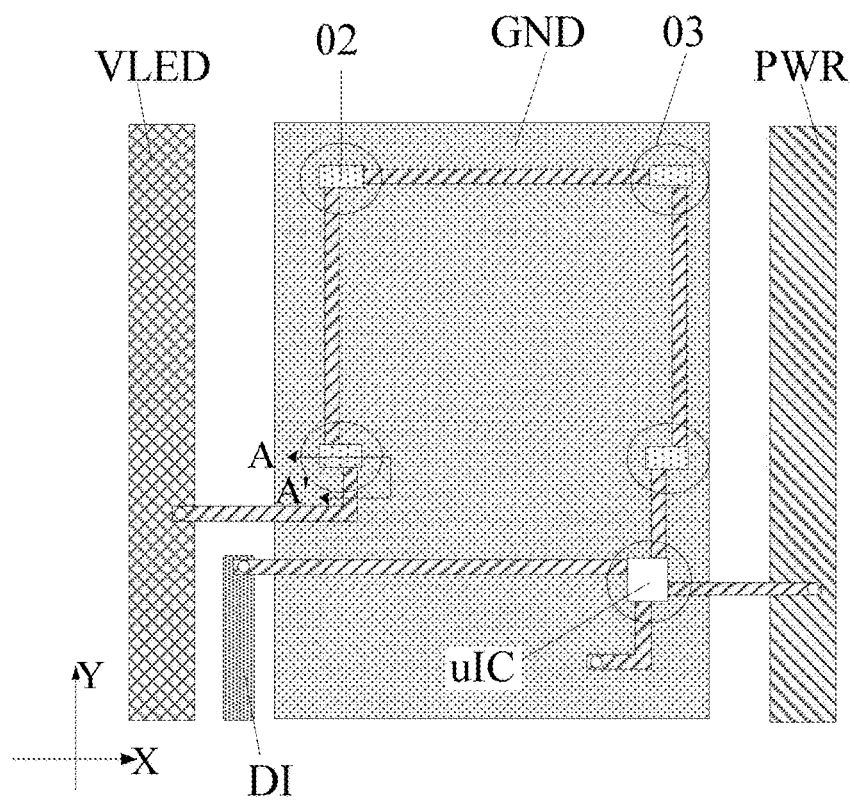
FIG. 3 is another schematic diagram of a structure of a backlight module according to an embodiment of the present disclosure.

FIG. 3 shows that one light-emitting unit 02' includes four light-emitting diodes 02 arranged in series while a micro-integrated circuit uIC provides signals to the four light-emitting diodes 02 in one light-emitting unit 02'. In some embodiments, one micro-integrated circuit uIC may also provide signals to a plurality of light-emitting units 02'. On the driving backplate including the micro-integrated circuit uIC, a transparent protection structure 03 is provided on a side of the light-emitting diodes 02 away from the driving backplate, which can protect the wrapped micro-integrated circuit uIC. In addition, in order to facilitate manufacturing, manufacturing requirements on the transparent protection structure 03 above the micro-integrated circuit uIC and the transparent protection structures 03 above the light-emitting diodes 02 are the same, and both are manufactured and formed in a same process.

It can be understood that the driving backplate 01 includes a light-emitting area and a peripheral area. All the light-emitting diodes 02 and the micro-integrated circuit uIC are disposed in the light-emitting area, and the light-emitting diodes 02 and the micro-integrated circuit uIC are electrically connected with corresponding pads on the driving backplate 01 through a series of processes such as picking, transferring and fixing. The peripheral area is used for connection with an external driving circuit, such as a flexible circuit board (FPC) or a printed circuit board (PCB), for example, by providing bonding pads 107 in the peripheral area to electrically connect with a gold finger structure on the circuit board.

For example, a light-emitting diode 02 includes a light-emitting part 203 and two pins 201 and 202 (which are respectively N pad and P pad), which are respectively connected to the pads 101 on the driving backplate 01 through solder paste T, and each pad 101 is connected according to positions of the light-emitting diodes 02 in the electrical circuit. Specifically, in FIG. 3, a P pad of a lower left light-emitting diode 02 is connected to a driving voltage line VLED, a N pad of the lower left light-emitting diode 02 is connected to a P pad of an upper left light-emitting diode 02, a N pad of the upper left light-emitting diode 02 is connected to a P pad of an upper right light-emitting diode 02, a N pad of the upper right light-emitting diode 02 is connected to a P pad of a lower right light-emitting diode 02, and a N pad of the lower right light-emitting diode 02 is connected to an output terminal out of the micro-integrated circuit uIC. In some embodiments, the micro-integrated circuit uIC may have a plurality of pins, e.g. four pins, which are respectively connected by solder paste to pads on the driving backplate 01, and the pads are in turn connected to a source power line PWR, a common voltage line GND, an address line DI, and a light-emitting diode 02 in the corresponding light-emitting unit 02', respectively.

Figure 2:
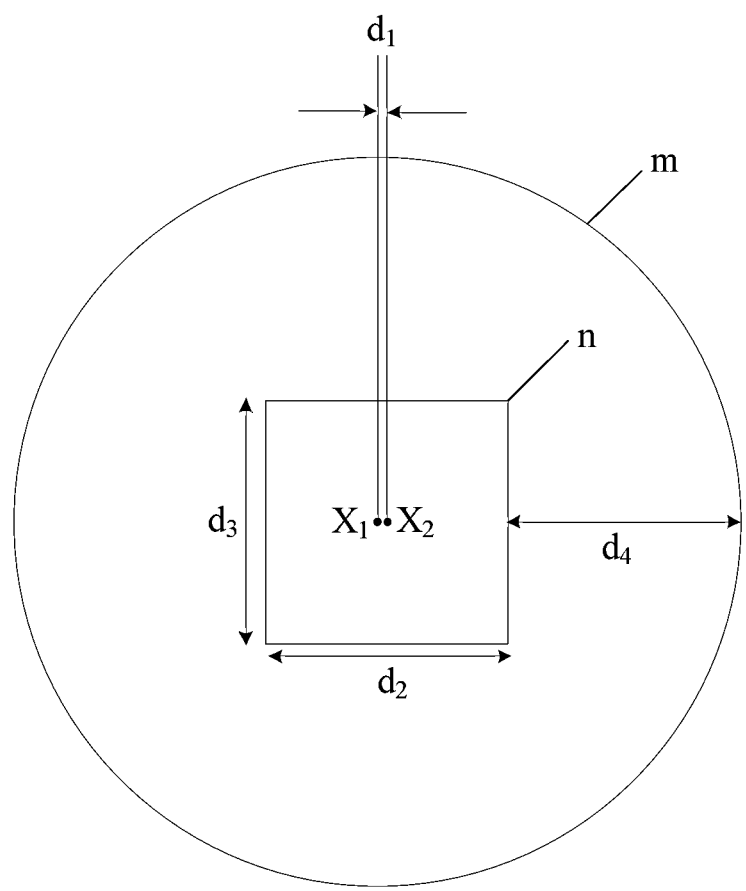
FIG. 2 is an enlarged structural diagram of a light-emitting unit in FIG. 1.

In some embodiments, in the above-mentioned backlight module according to the embodiment of the present disclosure, as shown in FIG. 2, a distance $d_4$ between a boundary m of the orthographic projection of the transparent protection structure 03 on the driving backplate 01 and a boundary n of the orthographic projection of the light-emitting diode 02 on the driving backplate 01 may be greater than 50 µm and less than one-half of a distance between geometric centers of two adjacent light-emitting diodes to achieve effective protection for the light-emitting diodes 02 and improve the light efficiency.

In some embodiments, in the above-mentioned backlight module according to the embodiment of the present disclosure, limited by accuracy of the manufacturing process of the steel mesh and an arrangement density of the light-emitting diodes 01, as shown in FIG. 1, the distance d between the adjacent transparent protection structures 03 may be greater than 40 µm.

Figure 4:
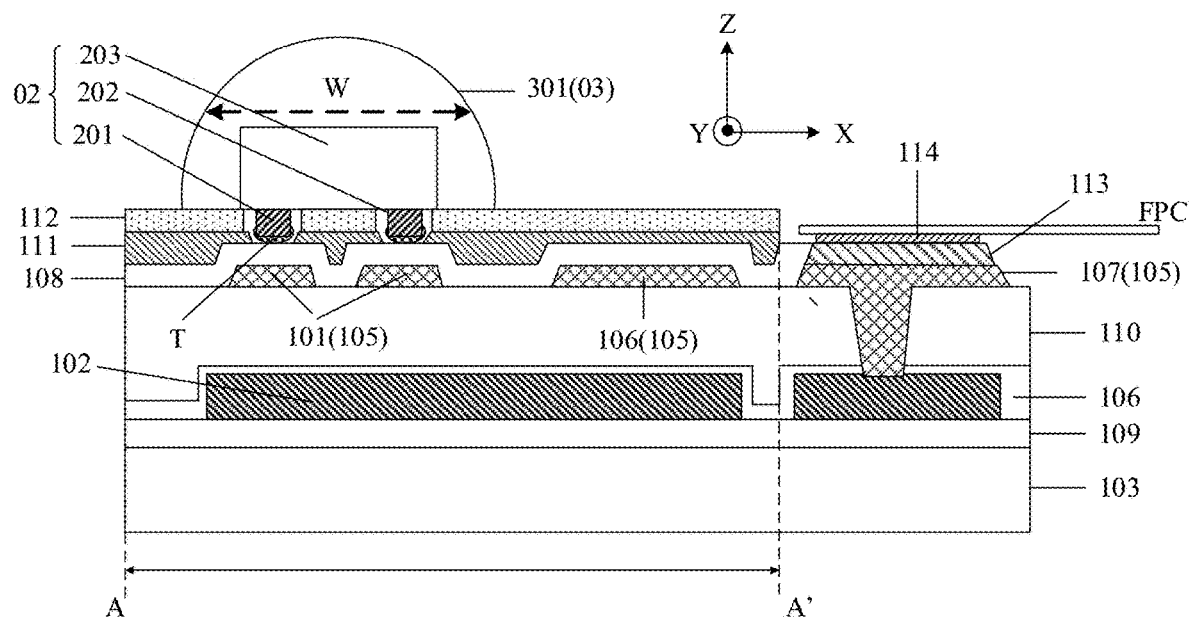
FIG. 4 is a schematic diagram of a sectional structure of the backlight module taken along a sectional line AA' in FIG. 3.
Figure 5:
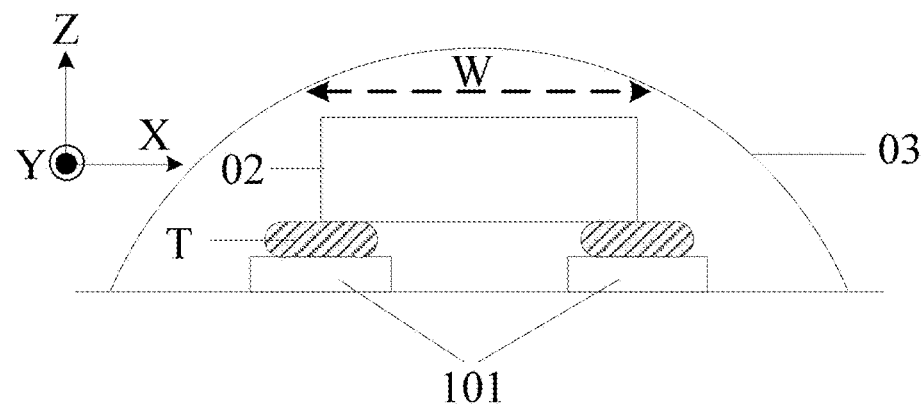
FIG. 5 is another schematic diagram of a sectional structure of a backlight module according to an embodiment of the present disclosure.
Figure 6:
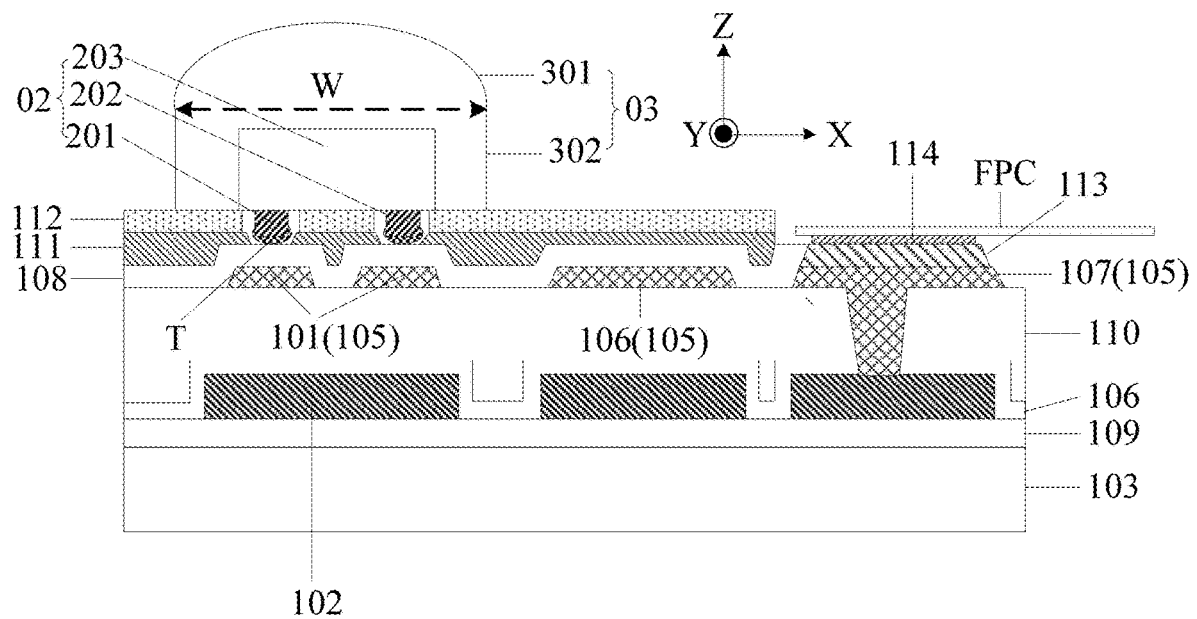
FIG. 6 is another schematic diagram of a sectional structure of a backlight module according to an embodiment of the present disclosure.

In some embodiments, in the above-mentioned backlight module according to the embodiment of the present disclosure, as shown in FIGS. 4 to 6, a surface of the transparent protection structure 03 may include a curved surface 301, and an opening of the curved surface 301 faces a light-emitting diode 02. In other words, the transparent protection structure 03 may form a dome shape over the light-emitting diode 02, and the transparent protection structure 03 of this shape may be referred to as a Droplet Lens. In addition, in order to reduce a probability of total reflection of the light emitted from the light-emitting diode 02 on an interface between the transparent protection structure 03 and air, a refractive index of the transparent protection structure 03 may be between a refractive index of the light-emitting diode 02 and a refractive index of the air.

In a process of manufacturing the transparent protection structure 03 using steel mesh printing, the steel mesh can be removed first, and then heating and solidifying are performed in the same way as glue dispensing. At this time, because there is no blockage by the steel mesh, a shape of the solidified transparent protection structure 03 is determined by thixotropy and anti-collapse parameters of the glue itself, so the shape of the transparent protection structure 03 is similar to that of the transparent protective glue manufactured by the glue dispensing method. Based on this, in the above-mentioned backlight module according to the embodiment of the present disclosure, as shown in FIGS. 4 to 6, a width W of the curved surface 301 in a direction parallel to the driving backplate (i.e., the first direction X) is gradually reduced in a direction Z which is a direction facing away from the driving backplate, so that the transparent protection structure 03 has a hemispherical shape protruding in the direction facing away from the driving backplate.

In addition, in the process of manufacturing the transparent protection structure 03 by steel mesh printing, the glue can be heated for 10 mins-20 mins for pre-solidifying without demolding the steel mesh, and then the backlight module is finally solidified as a whole after demolding, so that collapse and deformation of the transparent protection structure 03 before solidifying can be greatly avoided. The transparent protection structure 03 formed in this manner is different from that from the natural formation manner in the glue dispensing process because of the blockage of the steel mesh. Specifically, as shown in FIG. 6, the surface of the transparent protection structure 03 may further include a plurality of side surfaces 302 extending from the opening side of the curved surface 301 to contact with the driving backplate 01 in the direction perpendicular to the plane where the driving backplate 01 is located (i.e., in the Z direction), and a shape formed by the plurality of side surfaces 302 is the same as a window shape of the steel mesh.

Figure 7:
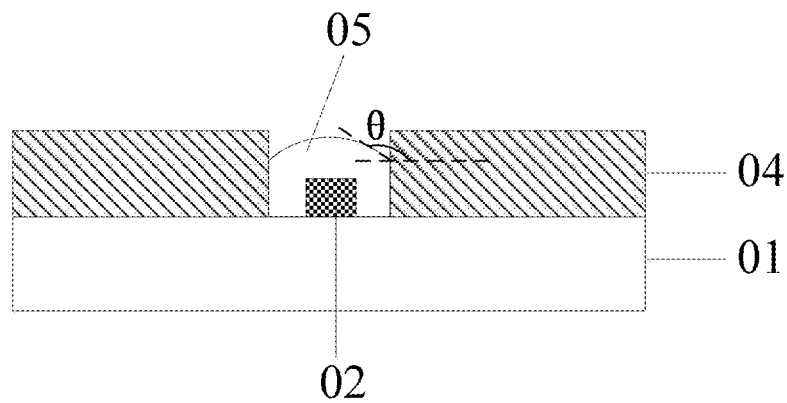
FIG. 7 is a schematic diagram of a structure of a transparent protection structure made of steel mesh according to an embodiment of the present disclosure.
Figure 8:
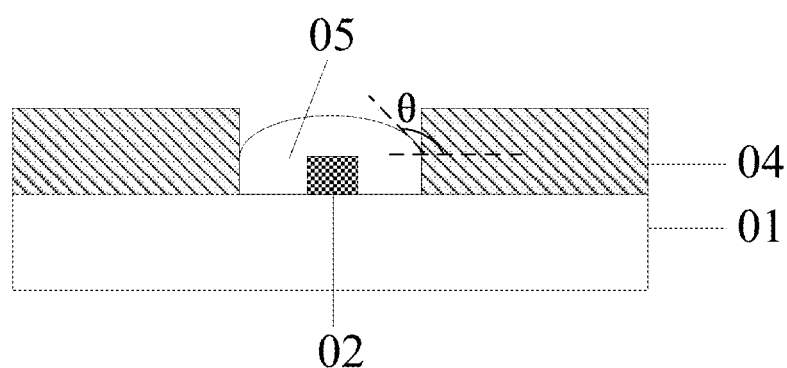
FIG. 8 is another schematic diagram of a structure of a transparent protection structure made of steel mesh according to an embodiment of the present disclosure.

It should be noted that in an actual manufacturing process of the transparent protection structure 03, the whole surface of the steel mesh is first coated with glue, and then the glue in an non-window area is scraped off, so that, theoretically, a surface of the glue should be basically flush with the surface of the steel mesh away from the driving backplate 01. However, after solidifying, a volume of the glue in the window area will be reduced after changing from a solid-liquid mixed state to a solid state, thus reducing its height. Therefore, the surface of the transparent protection structure 03 away from the driving backplate 01 manufactured by printing in the present disclosure will be lower than the surface of the steel mesh away from the driving backplate 01, thus will not be flush with the surface of the steel mesh away from the driving backplate 01. In addition, in some embodiments, a side wall of the window of the steel mesh 04 and the surface of the steel mesh 04 away from the driving backplate are subjected to hydrophobic coating treatment, so that a contact angle θ between the glue 05 and the side wall of the steel mesh 04 is obtuse, so that final morphology and size of the glue 05 can be adjusted by adjusting the window size, as shown in FIGS. 7 and 8.

In some embodiments, as shown in FIGS. 3, 4 and 6, the driving backplate 01 may further include a first conductive layer 102, and the first conductive layer 102 is generally configured to arrange various signal lines, such as the common voltage line GND, the drive voltage line VLED, the source power line PWR, the address line DI. Optionally, a thickness of the first conductive layer 102 is about 1.5 µm-7 µm, and a material of the first conductive layer 102 can include copper, for example, a laminated material such as MoNb/Cu/MoNb formed by sputtering. The material in the laminated material at a side close to a substrate 103 is MoNb with a thickness of about 300 Å, which is mainly used for improving adhesion between the film layer and the substrate 103. An intermediate layer material of the laminated material is Cu, which is a preferred material for electrical signal transmission channels. A material in the laminated material at a side away from the substrate 103 is MoNb with a thickness of about 200 Å, which can be used for protecting the intermediate layer from exposure and preventing oxidation of the intermediate layer surface with low resistivity. Since a thickness of a single time of sputtering generally does not exceed 1 µm, a plurality of times of sputtering is required to form the first conductive layer 102 that exceeds 1 µm. In addition, the first conductive layer 102 may also be formed by electroplating. Specifically, a seed layer may be formed by using MoNiTi to improve a nucleation density of metal grains in a subsequent electroplating process, and then copper with low resistivity may be prepared by electroplating, and then an oxidation-proof layer may be prepared, a material of which may be MoNiTi. Optionally, a surface of the first conductive layer 102 away from the substrate 103 may be covered by a first insulating layer 104 to ensure reliability and stability of electrical paths.

In some embodiments, as shown in FIG. 3, FIG. 4, and FIG. 6, the driving backplate 01 may further include a second conductive layer 105, and the second conductive layer 105 is typically used for arranging pads and connection leads 106. Optionally, the second conductive layer 105 has a film layer thickness of approximately 6000 Å. The pads are configured to bond various electrical components, and may include, for example, a pad 101 located in the light-emitting area for mounting the light-emitting diode 02, and/or a pad for mounting a functional element such as the micro-integrated circuit chip uIC or a sensor, and a bonding pad 107 located in the peripheral area for connection with a circuit board. A surface of the pad away from the substrate 103 needs to be partially exposed before being connected to an electronic component. In order to prevent the oxidation problem that may occur when the pad is exposed to the air during a process from the substrate preparation to the preparation of arranging the electronic component on the substrate, an oxidation-proof material layer may be provided only on the surface area where the pad is exposed, that is, the surface of the pad area will have one layer more structure than the area where the connection leads 106 are located. Optionally, the second conductive layer 105 is integrally provided as a laminated structure of at least two layers, the film material of which away from the substrate 103 is an oxidation-resistant metal or alloy material, and may be made of, for example, a laminated structure of MoNb/Cu/CuNi, in which the underlying material MoNb is mainly used for improving adhesion, an intermediate layer Cu in the laminated structure is mainly used for transmitting electrical signals due to low resistivity, and a top layer CuNi in the laminated structure can not only prevent oxidation of the intermediate layer, but also ensure firmness of connection with electronic components. The connection leads 106 may include a first lead extending along the first direction X and a second lead extending along the second direction Y, and surfaces of the first lead and the second lead away from the substrate 103 may be covered by a second insulating layer 108 to ensure reliability and stability of electrical paths.

In some embodiments, as shown in FIGS. 4 and 6, the driving backplate 01 may further include a buffer layer 109 located between the substrate 103 and the first conductive layer 102, a first planarization layer 110 located between the first insulating layer 106 and the second conductive layer 105, a second planarization layer 111 and a reflective layer 112 sequentially located at a side of the second insulating layer facing away from the second conductive layer 105, a transparent electrode 113 on a bonding pad 107 in the peripheral area, and an anisotropic conductive adhesive 114 located between the transparent electrode 113 and a flexible printed circuit board FPC. The buffer layer 109 can avoid influence of impurities in the substrate 103 on the conductivity of the first conductive layer 102, the first planarization layer 110 can provide a planar surface for manufacturing of the second conductive layer 105. The second planarization layer 111 can provide a planar surface for subsequent bonding of the light-emitting diodes 02. The reflective layer 112 can be made of white ink for improving the reflectivity of the driving backplate 01 to reduce light loss. The transparent electrode 113 and the anisotropic conductive adhesive 114 are configured to achieve an electrical connection between the bonding pad 107 in the peripheral area and the flexible printed circuit board FPC.

Based on a same inventive concept, an embodiment of the present disclosure provides a method for manufacturing a backlight module. Since a problem solving principle of the method is similar to a problem solving principle of the backlight module, the implementation of the method according to the embodiment of the present disclosure can refer to the implementation of the backlight module according to the embodiment of the present disclosure, and the repetitions will not be repeated.

Figure 9:
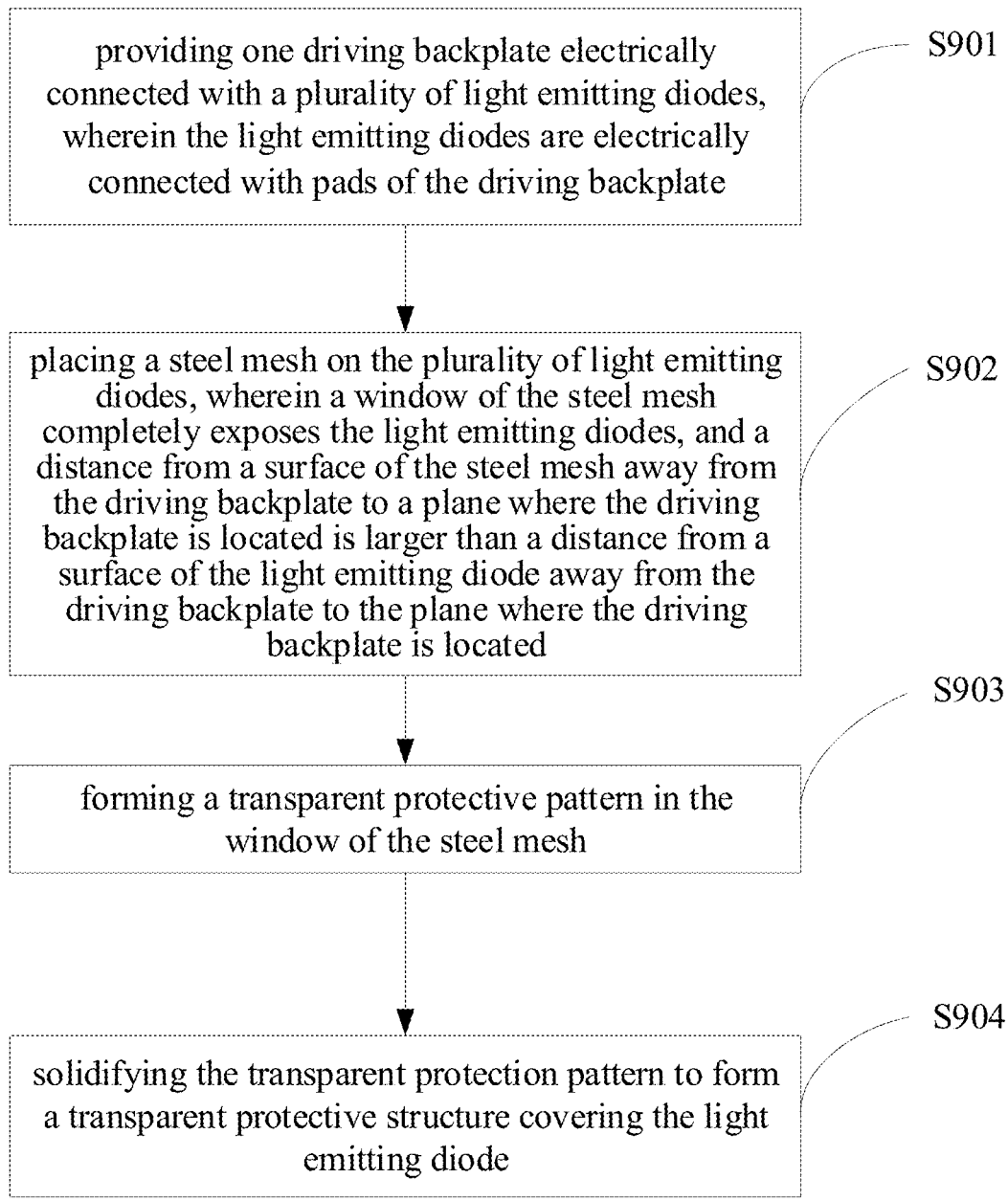
FIG. 9 is a flowchart of a method for manufacturing a backlight module according to an embodiment of the present disclosure.

Specifically, an embodiment of the present disclosure provides a method for manufacturing a backlight module, as shown in FIG. 9, which includes the following steps:

S901: providing a driving backplate electrically connected with a plurality of light-emitting diodes, wherein the light-emitting diodes are electrically connected with pads of the driving backplate;

S902: placing a steel mesh on the plurality of light-emitting diodes, wherein a window of the steel mesh completely exposes a light-emitting diode, and a distance from a surface of the steel mesh facing away from the driving backplate to a plane where the driving backplate is located is larger than a distance from a surface of the light-emitting diode facing away from the driving backplate to the plane where the driving backplate is located;

S903: forming a transparent protective pattern in the window of the steel mesh; and S904: solidifying the transparent protection pattern to form a transparent protection structure covering the light-emitting diode.

Figure 10:
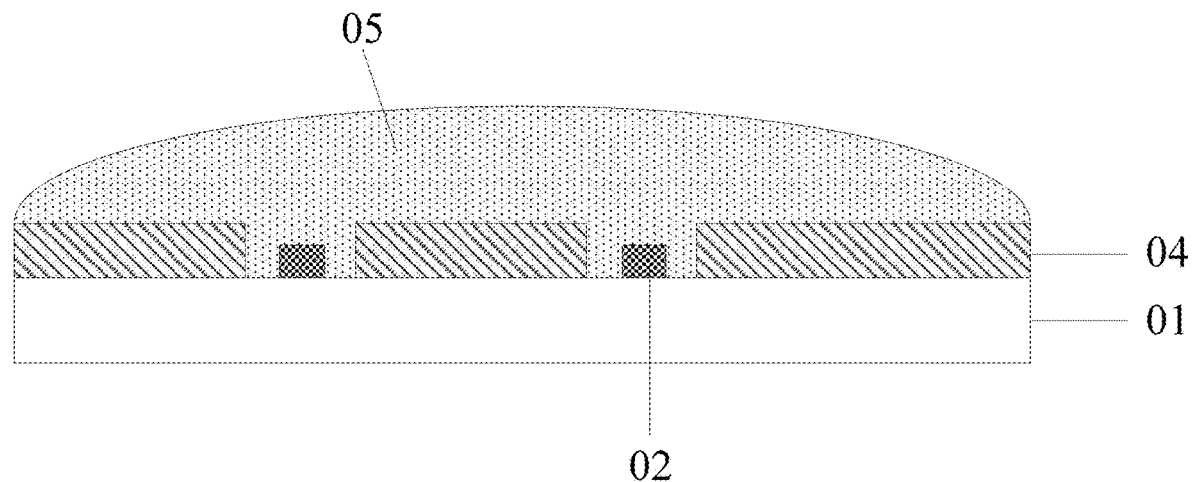
FIG. 10 is a schematic diagram of a structure of a backlight module in a manufacturing process according to an embodiment of the present disclosure.
Figure 11:
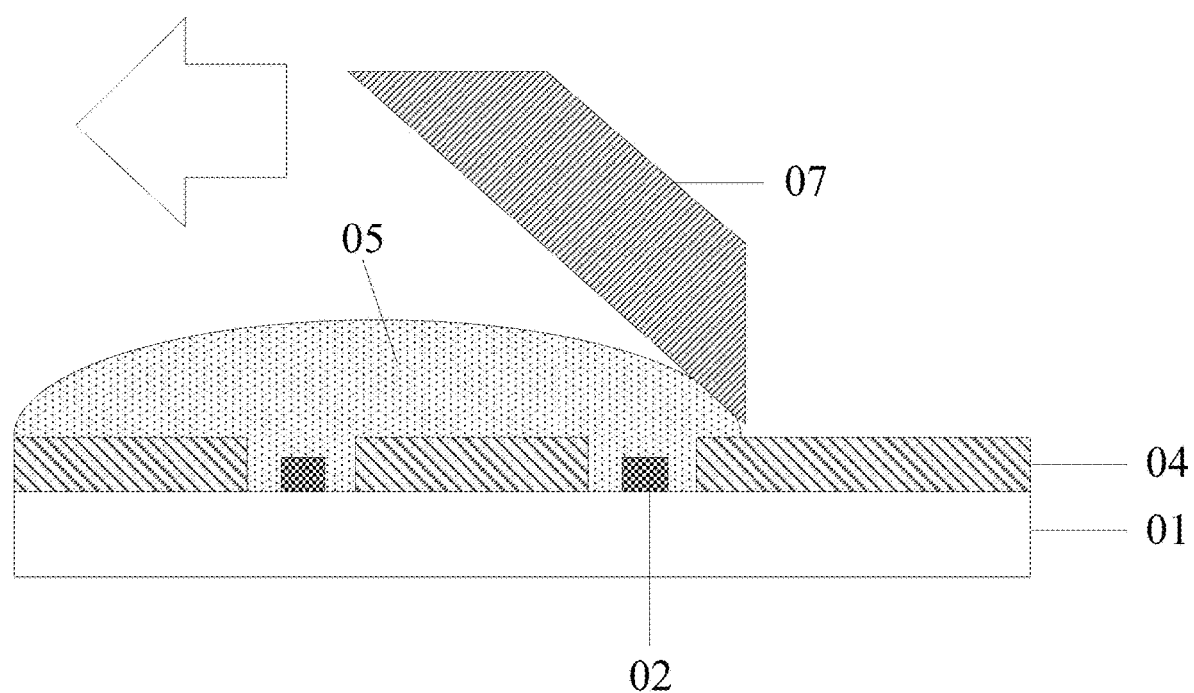
FIG. 11 is another schematic diagram of a structure of a backlight module in a manufacturing process according to an embodiment of the present disclosure.
Figure 12:
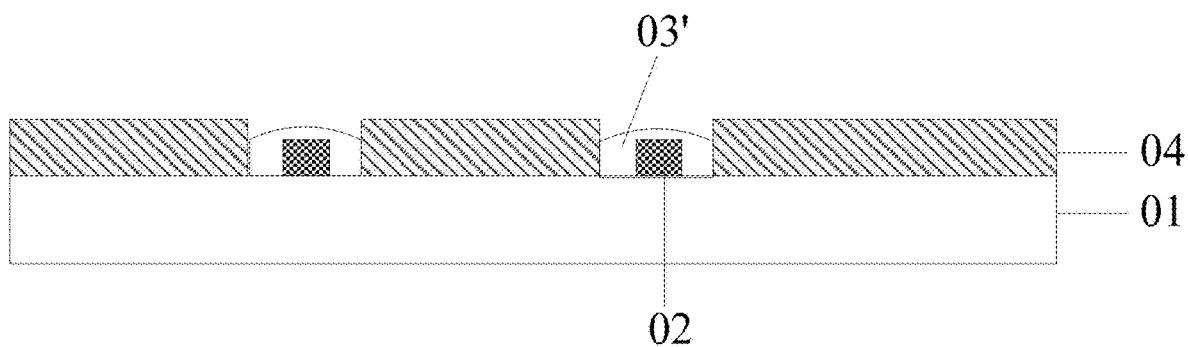
FIG. 12 is another schematic diagram of a structure of a backlight module in a manufacturing process according to an embodiment of the present disclosure.

In some embodiments, in the method for manufacturing according to the embodiment of the present disclosure, the step S803 in which the transparent protective pattern is formed in the window of the steel mesh can be specifically implemented by the followings:

forming a transparent protective layer 06 on a whole surface of the steel mesh 04 facing away from the driving backplate 01. In some embodiments, both the surface and the window of the steel mesh 04 may be hydrophobically coated so that a contact angle of the glue 05 with the surface of the steel mesh 04 is obtuse without overflowing the area where the driving backplate is located, as shown in FIG. 10;

removing the transparent protective layer 06 on the surface of the steel mesh 04 with a scraper 07 to form a transparent protective pattern 03' located in the window of the steel mesh 04, as shown in FIGS. 11 and 12. Since the window of the steel mesh 04 is hydrophobically coated, the contact angle θ of the glue 05 with the side wall of the steel mesh 04 is obtuse.

In some embodiments, in the method according to the embodiment of the present disclosure, the step S904 in which the transparent protection pattern is solidified can be implemented by the followings:

pre-solidifying the transparent protective pattern at a temperature of 100° C.-150° C. for 10 mins-20 mins under constraint of the steel mesh, that is, the transparent protective pattern is pre-solidified without removing the steel mesh. At this time, a surface of the transparent protection structure 03 formed after pre-solidifying includes a curved surface 301 protruding away from the light-emitting diode 02, and a plurality of side surfaces 302 extending from an opening side of the curved surface 301 to be in contact with the driving backplate 01 and surround the light-emitting diode 02, and a shape formed by the plurality of side surfaces is approximately the same as the window shape of the steel mesh.

Subsequently, the steel mesh can be removed, and after the steel mesh is removed, the transparent protective pattern is finally solidified at the temperature of 100° C.-150° C. for 30 mins-60 mins to obtain the transparent protection structure 03.

In some embodiments, in the above-described method according to the embodiment of the present disclosure, before performing step S903 in which the transparent protective pattern is solidified, the following step may also be performed: removing the steel mesh. That is, after removing the steel mesh, the transparent protection pattern is solidified, specifically, after the steel mesh is removed, the transparent protective pattern can be solidified at the temperature of 100° C.-150° C. for 40 mins-80 mins. In this way, the solidified transparent protection structure 03 has a hemispherical shape similar to that of the transparent protective glue produced by the glue dispensing process in the related art.

Apparently, in practice, the heating temperature and heating duration can be flexibly selected according to the material characteristics of the transparent protection pattern.

Based on the same inventive concept, an embodiment of the present disclosure provides a display apparatus, including the backlight module according to any of the above embodiments of the present disclosure. Since a problem solving principle of the display apparatus is similar to the problem solving principle of the backlight module, implementation of the display apparatus according to the embodiment of the present disclosure can refer to the implementation of the backlight module according to the embodiment of the present disclosure, and their repetition will not be repeated.

Figure 13:
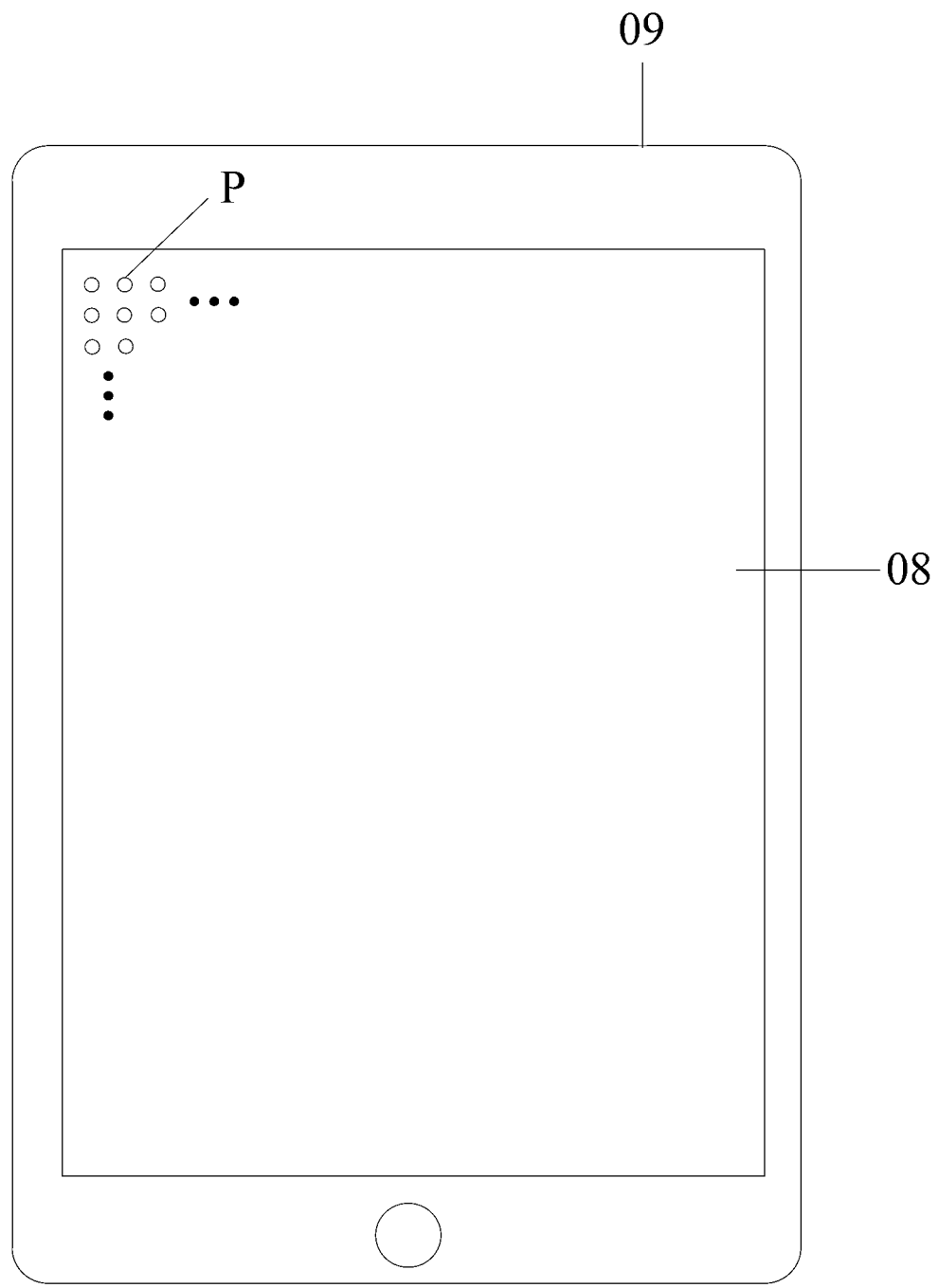
FIG. 13 is a schematic diagram of a structure of a display apparatus according to an embodiment of the present disclosure.
Figure 14:
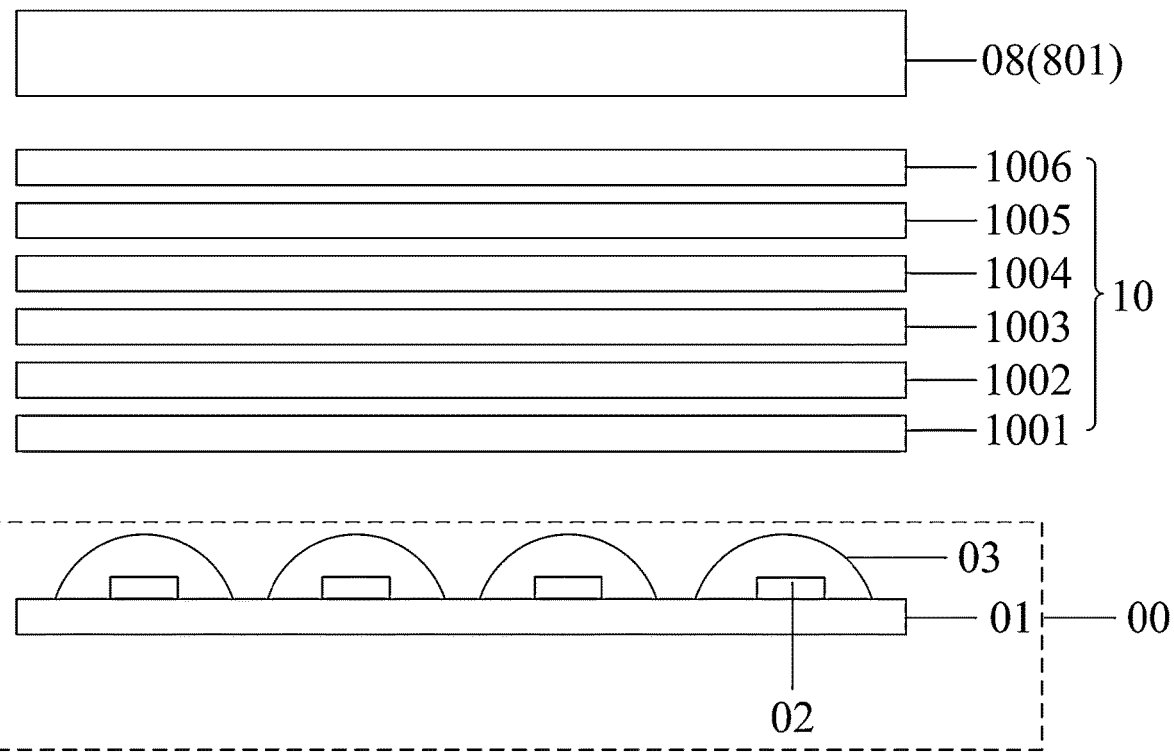
FIG. 14 is a schematic diagram of a sectional structure of a display apparatus according to an embodiment of the present disclosure.

Specifically, as shown in FIGS. 13 and 14 the display apparatus according to the embodiment of the present disclosure may be provided with a display 08. The display 08 may include a liquid crystal pixel array or other display structure backlit by light from a direct illumination type backlight unit. FIG. 13 shows a perspective view of an exemplary electronic device of the type that may be provided with a display having a direct illumination type backlight unit. The display apparatus of FIG. 13 may be a computing device such as a laptop computer, a computer monitor including an embedded computer, a tablet computer, a cellular phone, a media player, or other handheld or portable electronic device, a smaller device (such as a wrist watch device), a hanging device, a headset or earpiece device, a device embedded in glasses or other device worn on a user's head, or other wearable or miniature device, a television, a computer display that does not include an embedded computer, a gaming device, a navigation device, an embedded system (such as a system in which an electronic device having a display is installed in a kiosk or car), a device that implements two or more of the functions of these devices, or other electronic devices.

As shown in FIG. 13 the display 08 may be mounted in a housing 09. The display 08 may be a touch screen display incorporated with conductive capacitive touch sensor electrode layers or other touch sensor components (e.g. resistive touch sensor components, acoustic touch sensor components, force-based touch sensor components, light-based touch sensor components, etc.) or may be a non-touch display. The capacitive touch screen electrode may be formed from an indium oxide tin pad or an array of other transparent conductive structures.

The display 08 may include an array of pixels P formed by liquid crystal display (LCD) components or may have an array of pixels based on other display technologies. FIG. 14 shows a cross-sectional side view of the display 08. As shown in FIG. 13, the display 08 may include a pixel array 801 of pixels P as shown in FIG. 1. The pixel array 801 may be formed from a liquid crystal display module (sometimes referred to as a liquid crystal display or liquid crystal layer) or other suitable pixel array structure. The liquid crystal display for forming the pixel array 801 may include, for example, upper and lower polarizers, a color filter layer, and a thin film transistor layer interposed between the upper and lower polarizers, and a liquid crystal material layer interposed between the color filter layer and the thin film transistor layer. Other types of liquid crystal display structures may be used to form the pixel array 801 if desired.

As shown in FIG. 13, the display apparatus may further include a plurality of optical films 10 formed over the backlight module 00, and the optical films 10 may include a first light diffusion layer 1001, a partial reflective layer 1002, a color conversion layer 1003 (which may include a phosphor layer and a partial reflective layer), a collimation layer 1004, a brightness enhancement film 1005, a diffuser layer 1006, and/or other optical films.

The light-emitting diode 02 included in the backlight module 00 may emit light having any suitable color (e.g. blue, red, green, white, etc.). The light emitted from the light-emitting diode 02 can be uniformly diffused by the first light diffusion layer 1001. The partial reflective layer 1002 (sometimes referred to as a dichroic layer or a dichroic filter layer) may be configured to reflect a portion of the light diffused through the first light diffusion layer 1001 and to pass through the remaining portion of the light diffused through the first light diffusion layer 1001. In some embodiments, the partial reflective layer 1002 may include a multi-Bragg reflector and a diffuser layer. The color conversion layer 1003 may convert the light emitted from the light-emitting diode 02 from a first color to another color. For example, when the light-emitting diode 02 emits blue light, the color conversion layer 1003 may include a phosphor layer (e.g. a layer of white phosphor material or other photoluminescent material) that converts the blue light into white light. In some embodiments, the color conversion layer 1003 may also include a partial reflective layer. For example, a partial reflective layer (sometimes referred to as a dichroic layer or dichroic filter layer) may reflect all red and green light and partially reflect blue light. In addition, the collimation layer 1004 may calibrate off-axis light, the brightness enhancement film 1005 may further aid in calibrating light, and the diffuser layer 1006 may homogenize light.

Figure 15:
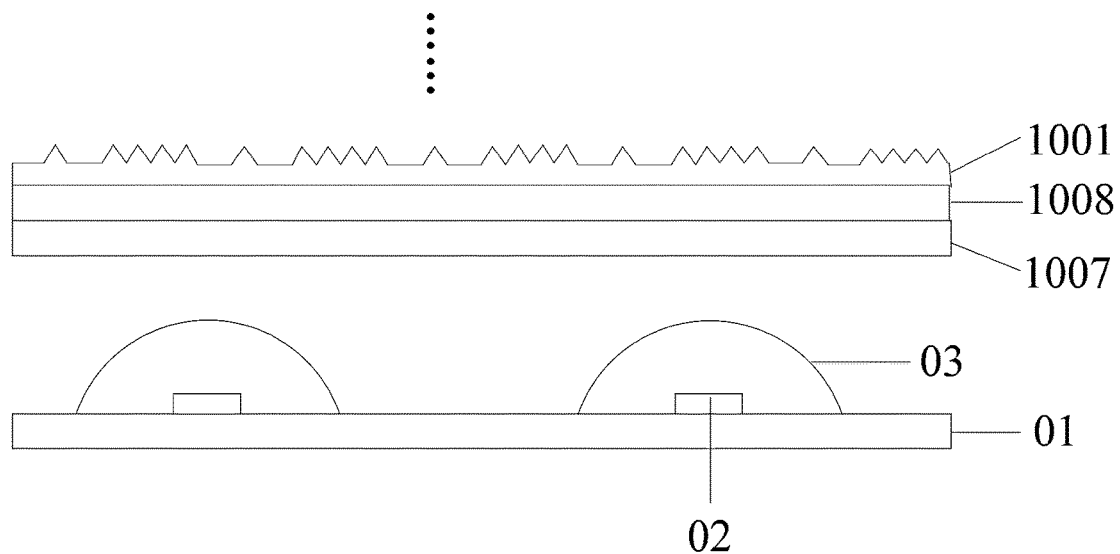
FIG. 15 is another schematic diagram of a sectional structure of a display apparatus according to an embodiment of the present disclosure.

In some embodiments, as shown in FIG. 15, a second light diffusion layer 1007 may further be formed on a lower surface of the first light diffusion layer 1001, and the second light diffusion layer 1007 may be coupled to a transparent protection structure 03 covering the light-emitting diode 02 (e.g., the second light diffusion layer 1007 may directly contact the transparent protection structure 03). In addition, as shown in FIG. 15, a waveguide layer 1008 (sometimes referred to as a light guide layer) may be interposed between the first light diffusion layer 1001 and the second light diffusion layer 1007.

As can be seen from the above description, in the present disclosure, the transparent protection structure is manufactured by a steel mesh printing method, which greatly improves the production efficiency, and improves the forming and uniformity of the transparent protection structure by adjusting the window size of the steel mesh and the thickness of the steel mesh.

Apparently, various modifications and variations to the embodiments of the present disclosure may be made by those skilled in the art without departing from the spirit and scope of the embodiments of the present disclosure. Thus, if these modifications and variations to the embodiments of the present disclosure fall within the scope of the claims of the present disclosure and their equivalent techniques, the present disclosure is intended to include these modifications and variations.

In order to solve at least the above technical problems existing in the related art, an embodiment of the present disclosure provides a backlight module, as shown in FIGS. 1 to 4, which may include:

a driving backplate 01 including a plurality of pads 101;
a plurality of light-emitting diodes 02 electrically connected to the pads 101;
a plurality of transparent protection structures 03 located at a side of the plurality of light-emitting diodes 02 facing away from the driving backplate 01, wherein the transparent protection structures 03 cover the light-emitting diodes, and there is a first distance $d_1$ between a geometric center $X_1$ of an orthographic projection of a transparent protection structure 03 on the driving backplate 01 and a geometric center $X_2$ of an orthographic projection of a light-emitting diode 02 on the driving backplate 01, a length of the orthographic projection of the light-emitting diode 02 on the driving backplate 01 is a second distance $d_2$, a width of the orthographic projection of the light-emitting diode 02 on the driving backplate 01 is a third distance $d_3$, a ratio of the first distance $d_1$ to the second distance $d_2$ (i.e. $d_1:d_2$) may be less than or equal to 1:2-1:10, and a ratio of the first distance $d_1$ to the third distance $d_3$ (i.e. $d_1:d_3$) may be less than or equal to 1:2-1:10.

In the above-mentioned backlight module according to the embodiment of the present disclosure, the transparent protection structure 03 can be manufactured by steel mesh printing. Size adjustment of the transparent protection structure 03 can be achieved by adjusting a window size of the steel mesh, and height adjustment of the transparent protection structure 03 in a direction perpendicular to the plane where the steel mesh is located can be achieved by adjusting a thickness of the steel mesh in the direction perpendicular to the plane where the steel mesh is located, so that the ratio between the first distance $d_1$ (between the geometric center $X_1$ of the orthographic projection of the transparent protection structure 03 on the driving back plate 01 and the geometric center $X_2$ of the orthographic projection of the light-emitting diode 02 on the driving back plate 01) and the side length size (i.e., the second distance $d_2$ or the third distance $d_3$) is reduced from 1:1-1:5 to less than or equal to 1:2-1:10, thereby improving the protection effect of the transparent protection structure on the covered light-emitting diode and improving the light efficiency.

etc.) or may be a non-touch display. The capacitive touch screen electrode may be formed from an indium oxide tin pad or an array of other transparent conductive structures.

The display 08 may include an array of pixels P formed by liquid crystal display (LCD) components or may have an array of pixels based on other display technologies. FIG. 14 shows a cross-sectional side view of the display 08. As shown in FIG. 13, the display 08 may include a pixel array 801 of pixels P as shown in FIG. 1. The pixel array 801 may be formed from a liquid crystal display module (sometimes referred to as a liquid crystal display or liquid crystal layer) or other suitable pixel array structure. The liquid crystal display for forming the pixel array 801 may include, for example, upper and lower polarizers, a color filter layer, and a thin film transistor layer interposed between the upper and lower polarizers, and a liquid crystal material layer interposed between the color filter layer and the thin film transistor layer. Other types of liquid crystal display structures may be used to form the pixel array 801 if desired.

As shown in FIG. 13, the display apparatus may further include a plurality of optical films 10 formed over the backlight module 00, and the optical films 10 may include a first light diffusion layer 1001, a partial reflective layer 1002, a color conversion layer 1003 (which may include a phosphor layer and a partial reflective layer), a collimation layer 1004, a brightness enhancement film 1005, a diffuser layer 1006, and/or other optical films.

The light-emitting diode 02 included in the backlight module 00 may emit light having any suitable color (e.g. blue, red, green, white, etc.). The light emitted from the light-emitting diode 02 can be uniformly diffused by the first light diffusion layer 1001. The partial reflective layer 1002 (sometimes referred to as a dichroic layer or a dichroic filter layer) may be configured to reflect a portion of the light diffused through the first light diffusion layer 1001 and to pass through the remaining portion of the light diffused through the first light diffusion layer 1001. In some embodiments, the partial reflective layer 1002 may include a multi-Bragg reflector and a diffuser layer. The color conversion layer 1003 may convert the light emitted from the light-emitting diode 02 from a first color to another color. For example, when the light-emitting diode 02 emits blue light, the color conversion layer 1003 may include a phosphor layer (e.g. a layer of white phosphor material or other photoluminescent material) that converts the blue light into white light. In some embodiments, the color conversion layer 1003 may also include a partial reflective layer. For example, a partial reflective layer (sometimes referred to as a dichroic layer or dichroic filter layer) may reflect all red and green light and partially reflect blue light. In addition, the collimation layer 1004 may calibrate off-axis light, the brightness enhancement film 1005 may further aid in calibrating light, and the diffuser layer 1006 may homogenize light.

In some embodiments, as shown in FIG. 15, a second light diffusion layer 1007 may further be formed on a lower surface of the first light diffusion layer 1001, and the second light diffusion layer 1007 may be coupled to a transparent protection structure 03 covering the light-emitting diode 02 (e.g., the second light diffusion layer 1007 may directly contact the transparent protection structure 03). In addition, as shown in FIG. 15, a waveguide layer 1008 (sometimes referred to as a light guide layer) may be interposed between the first light diffusion layer 1001 and the second light diffusion layer 1007.

As can be seen from the above description, in the present disclosure, the transparent protection structure is manufactured by a steel mesh printing method, which greatly improves the production efficiency, and improves the forming and uniformity of the transparent protection structure by adjusting the window size of the steel mesh and the thickness of the steel mesh.

Apparently, various modifications and variations to the embodiments of the present disclosure may be made by those skilled in the art without departing from the spirit and scope of the embodiments of the present disclosure. Thus, if these modifications and variations to the embodiments of the present disclosure fall within the scope of the claims of the present disclosure and their equivalent techniques, the present disclosure is intended to include these modifications and variations.

The invention claimed is:
1. A backlight module comprising:
a driving backplate comprising a plurality of pads;
a plurality of light-emitting diodes electrically connected with the pads;

a plurality of transparent protection structures located at a side of the plurality of light-emitting diodes facing away from the driving backplate, wherein the transparent protection structures cover the light-emitting diodes, and a first distance is provided between a geometric center of an orthographic projection of a transparent protection structure on the driving backplate and a geometric center of an orthographic projection of a light-emitting diode on the driving backplate, a length of the orthographic projection of the light-emitting diode on the driving backplate is a second distance, a width of the orthographic projection of the light-emitting diode on the driving backplate is a third distance, a ratio of the first distance to the second distance is less than or equal to 1:2, and a ratio of the first distance to the third distance is less than or equal to 1:2.

2. The backlight module according to claim 1, wherein the first distance is less than or equal to 50 μm, and the second distance is greater than or equal to 100 μm and less than or equal to 500 μm.

3. The backlight module according to claim 1, wherein a distance between a boundary of the orthographic projection of the transparent protection structure on the driving backplate and a boundary of the orthographic projection of the light-emitting diode on the driving backplate is greater than 50 μm and less than a half of a distance between geometric centers of two adjacent light-emitting diodes.

4. The backlight module according to claim 1, wherein a distance between adjacent transparent protection structures is greater than 40 μm.

5. The backlight module according to claim 1, wherein a surface of the transparent protection structure comprises a curved surface with an opening facing the light-emitting diode.

6. The backlight module according to claim 5, wherein a width of the curved surface in a direction parallel to the driving backplate is gradually reduced in a direction facing away from the driving backplate.

7. The backlight module according to claim 5, wherein surfaces of the transparent protection structure further comprises a plurality of side surfaces extending from an opening side of the curved surface to be in contact with the driving backplate in a direction perpendicular to a plane where the driving backplate is located, and a shape formed by the plurality of side surfaces is approximately the same as a window shape of a steel mesh.

8. The backlight module according to claim 1, wherein the light-emitting diodes are Mini light-emitting diodes.

9. A method for manufacturing a backlight module, comprising:
providing one driving backplate electrically connected with a plurality of light-emitting diodes, wherein the light-emitting diodes are electrically connected with pads of the driving backplate;
placing a steel mesh on the plurality of light-emitting diodes, wherein windows of the steel mesh completely exposes the light-emitting diodes, and a distance from a surface of the steel mesh facing away from the driving backplate to a plane where the driving backplate is located is larger than a distance from a surface at the light-emitting diodes away from the driving backplate to the plane where the driving backplate is located;
forming transparent protective patterns in the windows of the steel mesh; and
solidifying the transparent protection patterns to form transparent protection structures covering the light-emitting diodes.

10. The method according to claim 9, wherein the step of forming the transparent protective patterns in the windows of the steel mesh comprises:
forming a transparent protective layer on a whole surface of the steel mesh facing away from the driving backplate; and
removing the transparent protective layer on the surface of the steel mesh by a scraper to form the transparent protective patterns in the windows of the steel mesh.

11. The method according to claim 10, wherein the step of solidifying the transparent protective patterns comprises:
pre-solidifying the transparent protective patterns for 10 mins-20 mins at a temperature of 100° C.-150° C. under constraint of the steel mesh;
removing the steel mesh; and
finally solidifying the transparent protective patterns for 30 mins-60 mins at the temperature of 100° C.-150° C.

12. The method according to claim 9, wherein prior to solidifying the transparent protective patterns, the method further comprises: removing the steel mesh.

13. The manufacturing method according to claim 12, wherein the step of solidifying the transparent protective patterns comprises:
solidifying the transparent protective patterns for 40 mins-80 mins at the temperature of 100° C.-150° C.

14. A display apparatus, comprising a backlight module according to claim 1.

15. The backlight module according to claim 2, wherein a surface of the transparent protection structure comprises a curved surface with an opening facing the light-emitting diode.

16. The backlight module according to claim 3, wherein a surface of the transparent protection structure comprises a curved surface with an opening facing the light-emitting diode.

17. The backlight module according to claim 4, wherein a surface of the transparent protection structure comprises a curved surface with an opening facing the light-emitting diode.

18. The backlight module according to claim 6, wherein surfaces of the transparent protection structure further comprises a plurality of side surfaces extending from an opening side of the curved surface to be in contact with the driving backplate in a direction perpendicular to a plane where the driving backplate is located, and a shape formed by the plurality of side surfaces is approximately the same as a window shape of a steel mesh.

19. The backlight module according to claim 1, wherein the ratio of the first distance to the second distance is less than or equal to 1:10, and the ratio of the first distance to the third distance is less than or equal to 1:10.

20. The backlight module according to claim 1, wherein the third distance is equal to the second distance.

* * * * *